(12) United States Patent
Chen et al.

(10) Patent No.: US 6,737,320 B2
(45) Date of Patent: May 18, 2004

(54) DOUBLE-DOPED POLYSILICON FLOATING GATE

(75) Inventors: Chun Chen, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,523

(22) Filed: Aug. 29, 2002

(65) Prior Publication Data

US 2004/0043561 A1 Mar. 4, 2004

(51) Int. Cl.$^7$ ............................................. H01L 21/336
(52) U.S. Cl. ........................ 438/257; 438/532; 438/592
(58) Field of Search ............................... 257/314–326; 438/257–267, 532, 585–596

(56) References Cited

U.S. PATENT DOCUMENTS

| | | | | |
|---|---|---|---|---|
| 3,731,163 A | * | 5/1973 | Shuskus | 257/324 |
| 4,682,407 A | * | 7/1987 | Wilson et al. | 438/517 |
| 4,914,046 A | * | 4/1990 | Tobin et al. | 438/592 |
| 5,691,560 A | * | 11/1997 | Sakakibara | 257/316 |
| 5,841,161 A | * | 11/1998 | Lim et al. | 257/315 |
| 6,111,287 A | * | 8/2000 | Arai | 257/317 |

OTHER PUBLICATIONS

Muller, et al., Device Electronics for Integrated Circuits, 2nd edition, 1986, John Wiley & Sons, New York, pp. 80.*
Horiguchi, Usuki, Goto, Futatsugi, Sugii and Yokoyama: "Retention Time Enhancement in Direct Tunneling Memory (DTM) Utilizing Floating Gate Depletion by Diffusion Stopper," pp. 458–458.3.

* cited by examiner

Primary Examiner—Long Pham
Assistant Examiner—Marcos D. Pizarro-Crespo
(74) Attorney, Agent, or Firm—Williams, Morgan & Amerson

(57) ABSTRACT

The present invention provides a method and apparatus for forming a double-doped polysilicon floating gate in a semiconductor memory element. The method includes forming a first dielectric layer on a semiconductor substrate and forming a floating gate above the first dielectric layer, the floating gate comprised of a first layer doped with a first type of dopant material and a second layer doped with a second type of dopant material that is opposite the first type of dopant material in the first layer. The method further includes forming a second dielectric layer above the floating gate, forming a control gate above the second dielectric layer, and forming a source and a drain in the substrate.

6 Claims, 8 Drawing Sheets

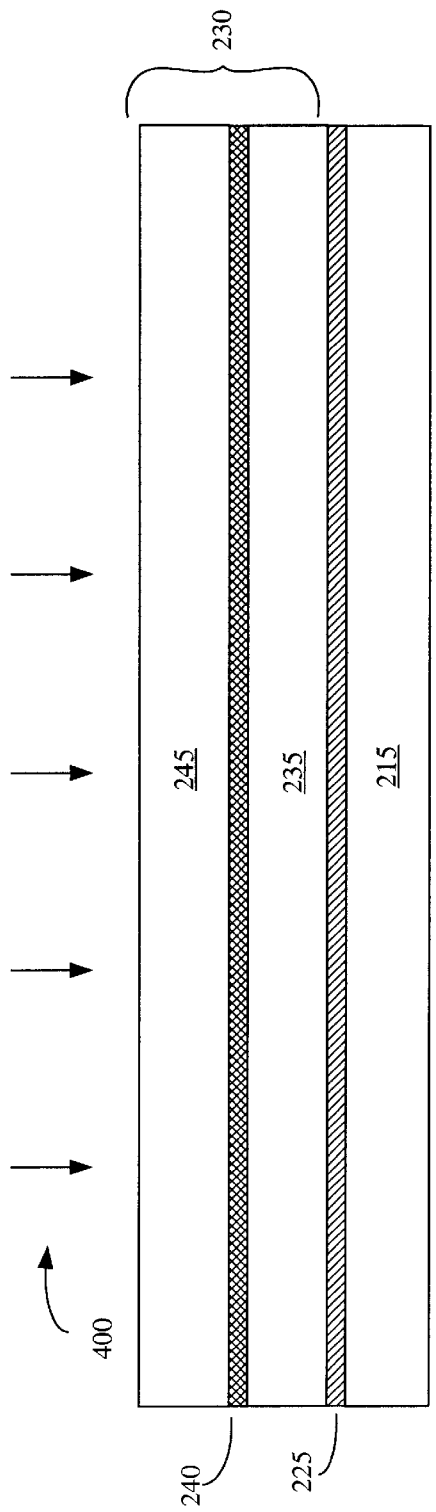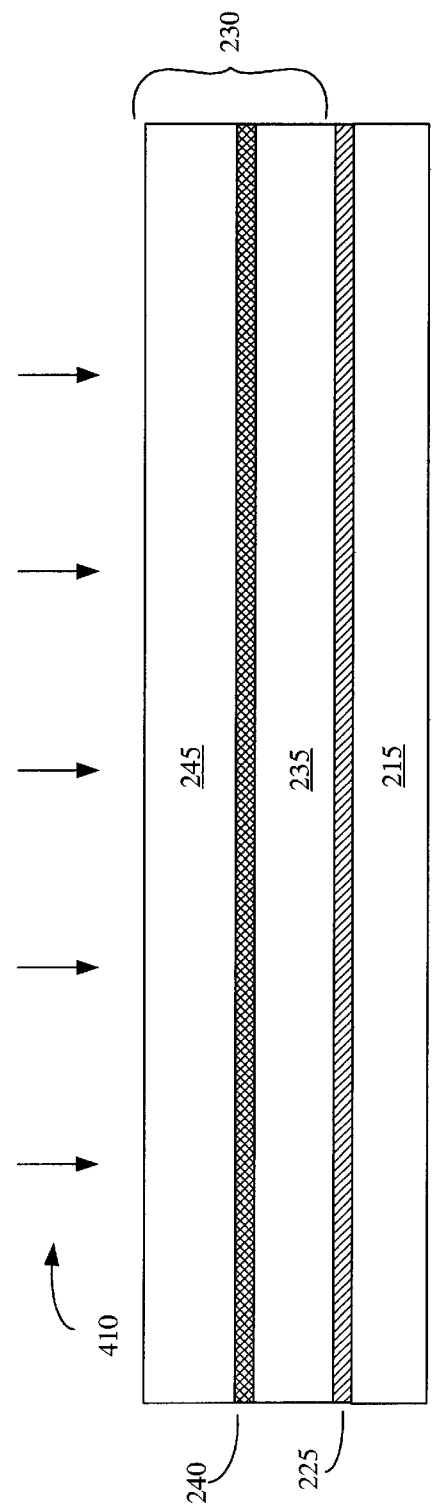
Figure 4A
Figure 4B

DOUBLE-DOPED POLYSILICON FLOATING GATE

BACKGROUND OF THE INVENTION

1. Field of the Invention

This invention relates generally to a semiconductor memory element, and, more particularly, to forming a double-doped polysilicon floating gate in a semiconductor memory element.

2. Description of the Related Art

Data storage devices in modern integrated circuits generally include a plurality of memory cells formed above a semiconductor substrate, such as silicon. For example, a semiconductor memory array may include 256K (256× 1024) memory cells. Electrically conducting lines are also formed in the semiconductor substrate and coupled to the memory cells. Bits of data are stored in the memory cells, for example, by providing a voltage or a current to a plurality of bit lines and a plurality of orthogonal word lines that are electrically coupled to the memory cells. In one embodiment, the memory cells are formed from non-volatile components, such as a floating gate transistor. For example, floating gates are used to form flash memory cells, EEPROM memory cells, and the like.

A traditional flash memory cell 100 is shown in FIG. 1. The flash memory cell 100 includes a source 110 and a drain 115 formed in a substrate 120, which may be comprised of a variety of semiconductor materials. For example, the substrate 120 may be comprised of silicon, which may be doped with n-type or p-type dopants. During operation of the flash memory cell 100, a channel 125 will be established in the substrate 120 between the source and drain regions 110, 115. The flash memory cell 100 also includes a first insulating layer 130 that is often called a tunnel oxide layer, a floating gate 105, a second insulating layer 135 that is often called an inter-poly insulation layer, and a control gate 140. The insulating layers 130, 135 may be dielectric layers. In the interest of clarity, the techniques for forming the various gates and layers described above, which are well known to those of ordinary skill in the art and are not material to the present invention, will not be discussed herein.

To program the flash memory cell 100, a first voltage $V_1$ is provided to the control gate 140. A second voltage $V_2$, which is usually smaller than the first voltage $V_1$, is provided to the drain 115, and third and fourth voltages $V_3$, $V_4$, which are generally smaller than the second voltage $V_2$, are provided to the source 110 and the substrate 120, respectively. For example, a first voltage $V_1$ of about 8–10 volts is provided to the control gate 140, a second voltage $V_2$ of about 4–5 volts is provided to the drain 115, and the source 110 and substrate 120 are grounded.

The voltage of about 8 volts on the control gate 140 and the resulting voltage differential of about 4 volts between the source 110 and the drain 115 will cause a current of electrons to flow through the channel 125 from the source 110 to the drain 115. As electrons flow through the channel 125, the voltage differential of about 8 volts between the control gate 140 and the substrate 120 will cause a portion of the electrons to "tunnel" through the first insulating layer 130 to the floating gate 105 and become trapped or stored therein. The presence or absence of the collected electrons in the floating gate 105 may be detected in a reading operation well known to those of ordinary skill in the art. For example, the presence of collected electrons in the floating gate 105 may be determined to represent a logic-low state, whereas the absence of collected electrons in the floating gate 105 may be determined to represent a logic-high state, or vice versa.

To erase the flash memory cell 100 once it has been programmed, different voltage levels are generally applied to the flash memory cell 100. For example, a first voltage $V_1$ of about negative 9 volts is provided to the control gate 140, a third voltage $V_3$ of about +9 volts. is provided to the source 110, and a fourth voltage $V_4$ of about +9 volts is provided to the substrate 120. The resulting voltage differential of about 18 volts between the control gate 140 and the substrate 120 causes a portion of the electrons in the floating gate 105 to "tunnel" through the first insulating layer 130 to the substrate 120, thus discharging the floating gate 105. In one embodiment, a second voltage $V_2$ may be allowed to float.

Although the flash memory cell 100 described above generally traps or stores electrons for a relatively long time compared to volatile memory cells such as DRAMs, and the like, a leakage current formed of electrons tunneling from the floating gate 105 to the substrate 120 may eventually discharge the flash memory cell 100. Furthermore, the effects of a leakage current generally increase as the size of non-volatile memory cells, such as the flash memory cell 100, decrease. Thus, future advances in semiconductor processing technology that tend to reduce the size of non-volatile memory cells will only exacerbate this problem.

The effects of the leakage current may be reduced by improving the insulating capabilities of the first and/or second insulating layers 130, 135 surrounding the floating gate 105. For example, the first and/or second insulating layers 130, 135 may be made thicker. However, such an approach adversely impacts the programming and erasing operations of the flash memory cell 100.

A method and structure are needed to reduce the effects of leakage current without unduly affecting the programming, reading, and/or erasure of the flash memory cell 100.

SUMMARY OF THE INVENTION

In one aspect of the instant invention, a method is provided for forming a double-doped polysilicon floating gate in a semiconductor memory element. The method includes forming a first dielectric layer on a semiconductor substrate and forming a floating gate above the first dielectric layer, the floating gate comprised of a first layer doped with a first type of dopant material and a second layer doped with a second type of dopant material that is opposite the first type of dopant material in the first layer. The method further includes forming a second dielectric layer above the floating gate, forming a control gate above the second dielectric layer, and forming a source and a drain in the substrate.

In one aspect of the present invention, an apparatus is provided. The apparatus includes a first dielectric layer formed on a semiconductor substrate and a double-doped floating gate formed above the dielectric layer. The apparatus further includes a second dielectric layer formed above the double-doped floating gate, a control gate formed above the second dielectric layer, and a source and a drain formed in the substrate.

BRIEF DESCRIPTION OF THE DRAWINGS

The invention may be understood by reference to the following description taken in conjunction with the accompanying drawings, in which like reference numerals identify like elements, and in which:

FIGS. 4A–B show cross-sectional views of various stages in a second illustrative process flow that may be used to form the memory cell shown in FIG. 1;

Figure 1:
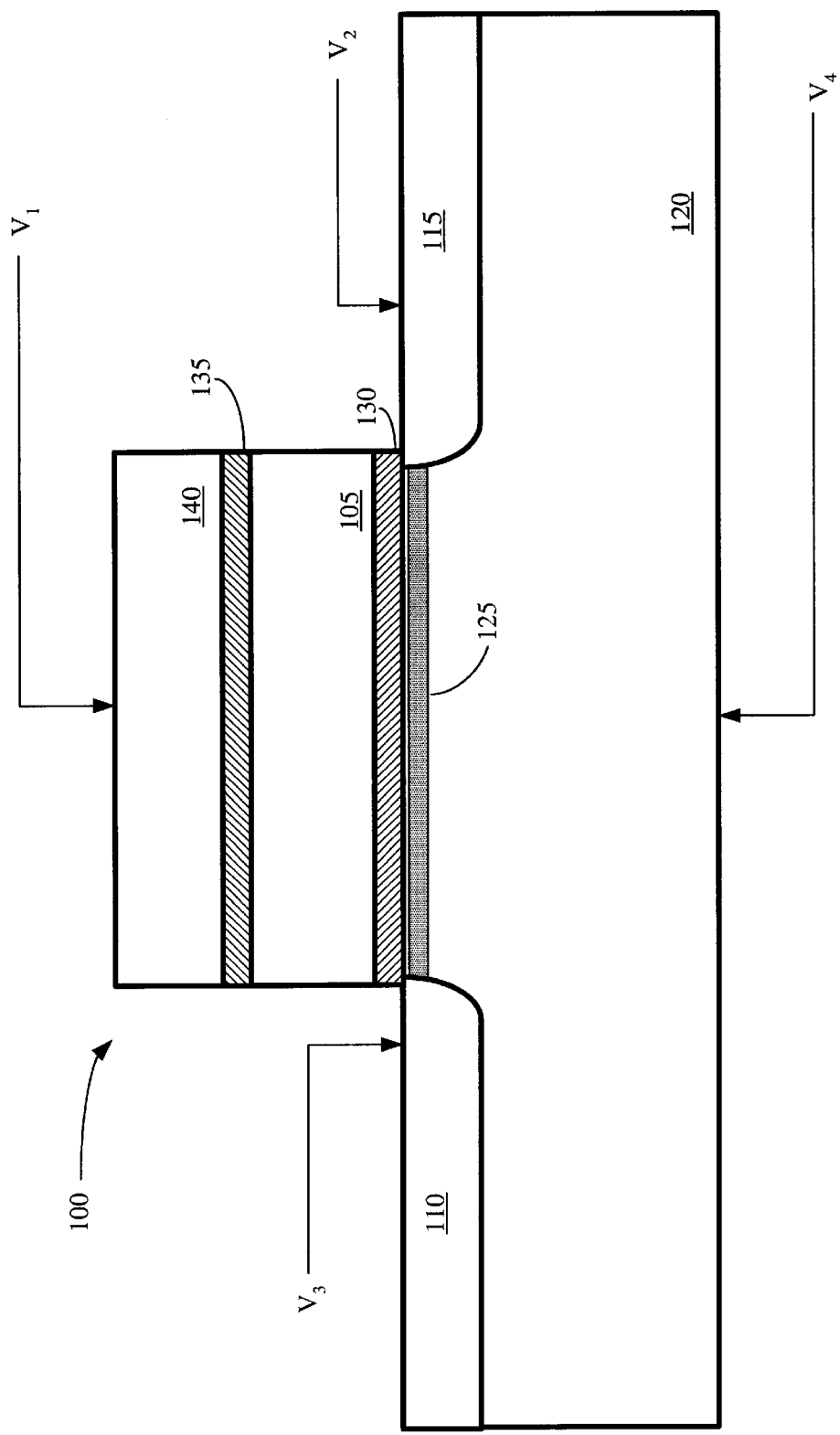
FIG. 1 shows a prior art flash memory cell including a floating gate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures depicted in the drawings have very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of forming a double-doped polysilicon floating gate and a device comprising the double-doped polysilicon floating gate element. Although the present invention will be disclosed in the context of the formation of an illustrative flash memory cell 100, those skilled in the art will understand after a complete reading of the present application that the present invention is not so limited. Moreover, the present invention may be employed using a variety of technologies, e.g., NMOS, PMOS, CMOS, etc., and it may be employed with a variety of different type devices, e.g., memory devices, logic devices, etc.

Figure 2:
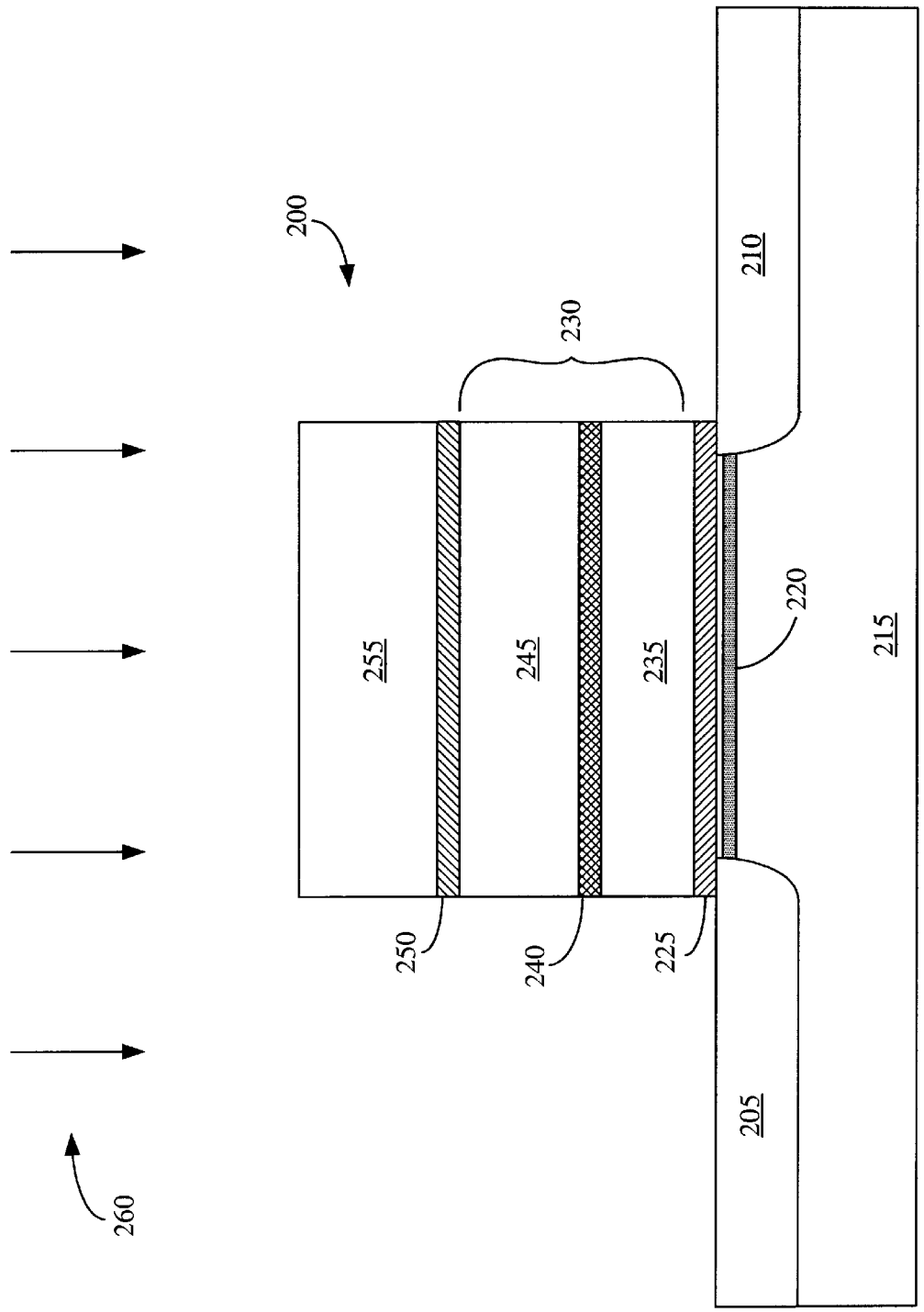
FIG. 2 is a cross-sectional view illustrating a first embodiment of a memory cell including a double-doped floating gate.

Referring now to FIG. 2, a first exemplary embodiment of a memory cell 200 is shown. The memory cell 200 includes a source region 205 and a drain region 210 in a substrate 215. As discussed above, the substrate 215 may be comprised of a variety of semiconductor materials. For example, in one embodiment, the substrate 215 is comprised of silicon, which is doped with p-type dopants. For another example, in one alternative embodiment, the substrate 215 is comprised of silicon, which is doped with n-type dopants. The source and drain regions 205, 210 may also be comprised of a variety of semiconductor materials. For example, the source and drain regions 205, 210 may be comprised of n-type doped silicon when the substrate 215 is comprised of p-type doped silicon. For another example, the source and drain regions 205, 210 may be comprised of p-type doped silicon when the substrate 215 is comprised of n-type doped silicon. As discussed above, a channel 220 may be located in the substrate 215 approximately between the source region 205 and the drain region 210.

A first insulating layer 225, which is sometimes referred to as a tunnel oxide layer, is located above the channel 220. The first insulating layer 225 may have a thickness ranging from approximately 10–100 Å and may be formed from one or more of a variety of dielectric materials, such as silicon dioxide ($SiO_2$), another oxide (e.g., Ge oxide), an oxynitride (e.g., silicon oxynitride), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. In one illustrative embodiment, the first insulating layer 225 is comprised of a thermally grown layer of silicon dioxide having a thickness ranging from approximately 10–100 Å.

The memory cell 200 also includes a double-doped floating gate 230. In the first exemplary embodiment of the present invention, the double-doped floating gate 230 includes a first polysilicon layer 235, a barrier layer 240, and a second polysilicon layer 245. The first polysilicon layer 235 has a thickness ranging from approximately 100–500 Å and may be doped with a p-type dopant material. For example, the first polysilicon layer 235 may be doped with boron atoms to a first dopant concentration ranging from approximately $10^{15}$–$10^{20}$ atoms/cm$^3$. The present invention, however, is not so limited. The first polysilicon layer 235 may be doped with other p-type dopant materials, such as boron difluoride, or may remain un-doped, without departing from the scope of the present invention. It will also be appreciated that the first dopant concentration may be larger or smaller than $10^{15}$–$10^{20}$ atoms/cm$^3$, without departing from the scope of the present invention.

In the first embodiment, the barrier layer 240 may be a silicon nitride (SiN) layer having a thickness ranging from approximately 10–50 Å. However, in alternative embodiments, the barrier layer 240 may include one or more of a variety of dielectric materials such as silicon dioxide ($SiO_2$), another oxide (e.g., Ge oxide), an oxynitride (e.g., silicon oxynitride), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The second polysilicon layer 245 has a thickness ranging from approximately 100–1500 Å and may be doped with an n-type dopant material. For example, the second polysilicon layer 245 may be doped with arsenic atoms to a second dopant concentration ranging from approximately $10^{18}$–$10^{21}$ atoms/cm$^3$. The present invention, however, is not so limited. The second polysilicon layer 245 may be doped with any appropriate n-type dopant material, without departing from the scope of the present invention. It will also be appreciated that the second dopant concentration may be larger or smaller than $10^{18}$–$10^{21}$ atoms/cm$^3$, without departing from the scope of the present invention.

The presence of the barrier layer 240 between the first and second polysilicon layers 235, 245 in the present embodiment, will reduce or eliminate the migration of dopant atoms from one polysilicon layer 235, 245 to the other. However, the use of the barrier layer 240 is a matter of design choice that may, in alternative embodiments, be eliminated.

The memory cell 200 further includes a second insulating layer 250, which is sometimes referred to as an inter-poly insulation layer. The second insulating layer 250 may have a thickness ranging from approximately 80–300 Å, for example, and may include one or more of a variety of dielectric materials, such as silicon dioxide ($SiO_2$), silicon nitride ($Si_3N_4$), another oxide (e.g., Ge oxide), an oxynitride (e.g., silicon oxynitride), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. In the first exemplary embodiment of the memory cell 200, a control gate 255 is positioned above the second insulating layer 250. In the illustrated embodiment, the control gate 255 is a layer of polysilicon doped with an n-type dopant material. For example, the control gate 255 may be doped with arsenic atoms to a dopant concentration ranging from about $10^{18}$–$10^{21}$ atoms/cm$^3$.

The memory cell 200 shown in FIG. 2 may be formed by a variety of techniques. The source region 205, the drain region 210, the first insulating layer 225, the second insulating layer 250, and the control gate 255 may be formed by a variety of techniques that are known to those of ordinary skill in the art. For example, the first insulating layer 225 may be thermally grown above the surface of the substrate 215. Using a mask, or after formation of one or more of the components of the double-doped floating gate 230 and control gate 255, an ion implantation step may be used to form the source region 205 and the drain region 210. An anneal step may also be employed. Well-known photolithography processes, thermal oxidation, deposition and etching processes, as well as other well known semiconductor manufacturing processes may also be employed.

To form the double-doped floating gate 230, dopant materials may be introduced into the first and second polysilicon layers 235, 245 by deposition and/or ion implantation. In one embodiment, the same technique, i.e. deposition or ion implantation, may be used to introduce the dopant materials into each of the first and second polysilicon layers 235, 245. However, the present invention is not so limited. In alternative embodiments, different techniques may be used to introduce the dopant materials into the first and second polysilicon layers 235, 245. For example, dopant materials may be introduced into the first polysilicon layer 235 during a deposition process that is used to form the first polysilicon layer 235, whereas the dopant materials may be introduced into the second polysilicon layer 245 by performing an ion implantation. Any combination of known doping techniques may be used to introduce the dopant material into the first and second polysilicon layers 235, 245.

Figure 3A:
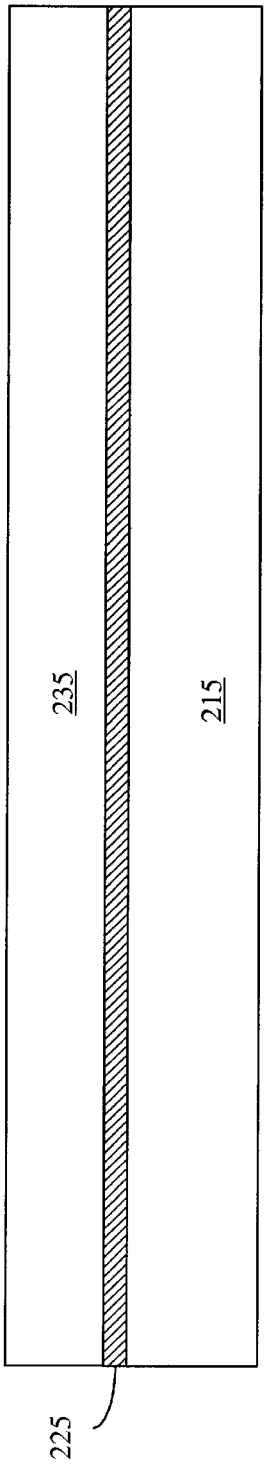
FIGS. 3A–D show cross-sectional views of various stages in a first illustrative process flow that may be used to form the memory cell shown in FIG. 1.
Figure 3B:
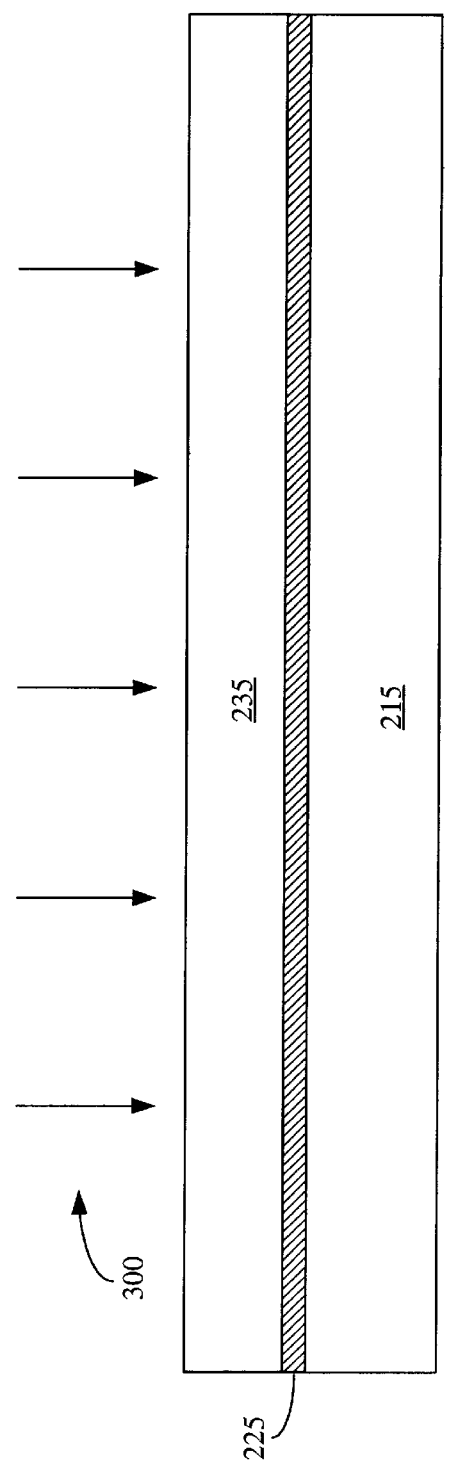

A first illustrative process flow that may be used to form the first embodiment of the memory cell 200 will now be described with reference to FIGS. 3A–D. In the first illustrative process flow, as illustrated in FIG. 3A, the first insulating layer 225 may be formed above the substrate 215 using a thermal oxidation step, which is a technique well-known to those of ordinary skill in the art. The first polysilicon layer 235 may then be deposited above the first insulating layer 225 by any of a variety of known techniques, e.g. high-density ionized metal (IMP) deposition, high-density inductively coupled plasma (ICP) deposition, physical vapor deposition (PVD), chemical vapor deposition (CVD), low-pressure CVD (LPCVD), plasma-enhanced CVD (PECVD), and the like. The first polysilicon layer 235 thus formed has a thickness ranging from approximately 100–500 Å.

The first polysilicon layer 235 may be doped with a p-type dopant material. In the first illustrative process flow, the first dopant material is introduced into the first polysilicon layer 235 by performing an ion implantation process as indicated by the arrows 300 shown in FIG. 3B. For example, depending upon the application, p-type dopant materials such as boron (B) or boron fluoride ($BF_2$) may be implanted into the first polysilicon layer 235. In one embodiment, the dopant material may be implanted at a dopant dose ranging from approximately $10^{10}$–$10^{15}$ ions/cm$^2$ and at an energy level ranging from approximately 1–50 keV. In another embodiment, the first polysilicon layer 235 may be doped in situ; that is, the first polysilicon layer 235 may be doped as it is being deposited above the first insulating layer 225. It should be understood that the present invention should not be considered as limited to any specific technique for forming the first polysilicon layer 235 or to any specific implant or doping parameters unless such limitations are expressly set forth in the appended claims.

Figure 3C:
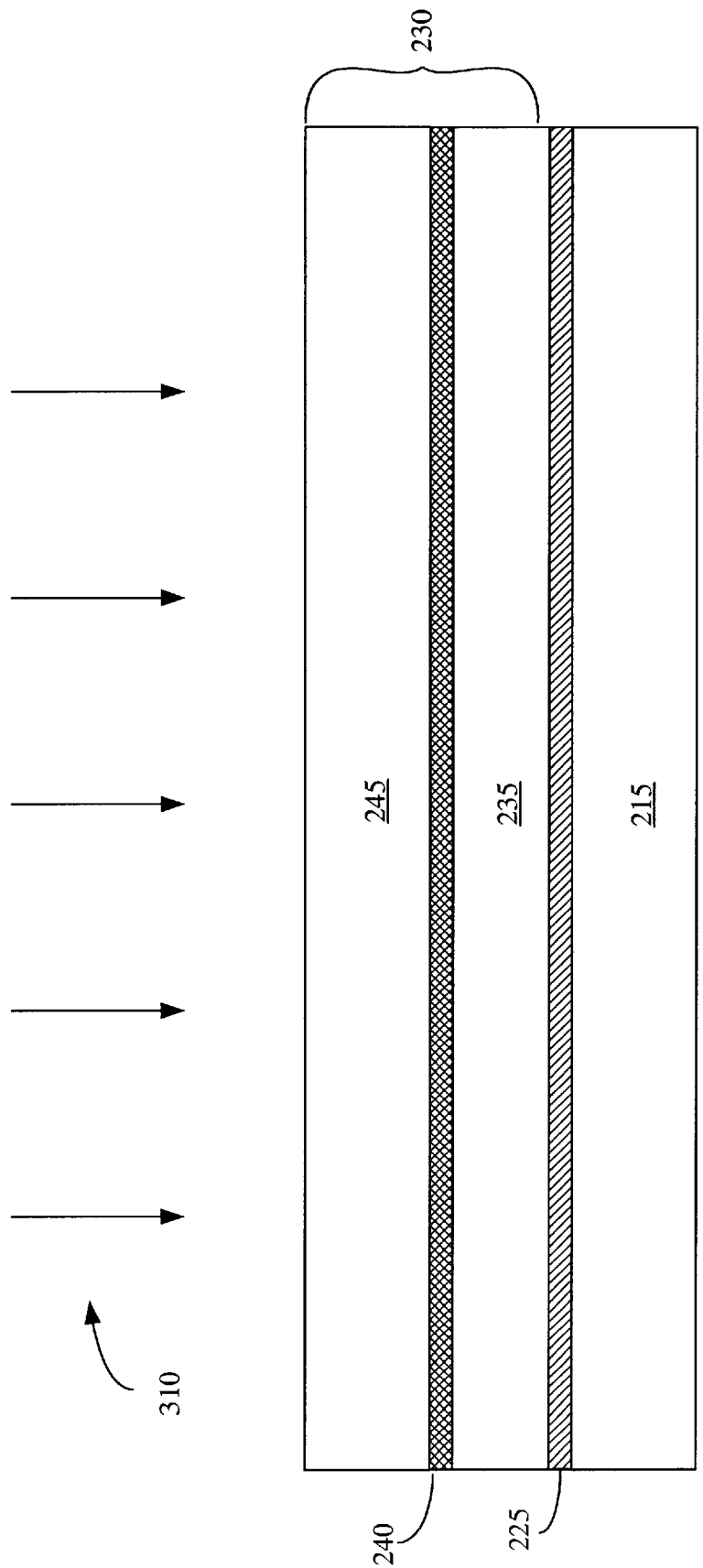

The barrier layer 240 may be formed above the first polysilicon layer 235, as shown in FIG. 3C. For example, in one embodiment, the barrier layer 240 may comprise silicon nitride or other suitable materials. In alternative embodiments, the barrier layer 240 may be formed by a variety of known techniques for forming such layers, e.g., CVD, LPCVD, PECVD, PVD, thermal growth, and the like. The barrier layer 240 thus formed may have a thickness ranging from approximately 10–50 Å. In the particular embodiment being described, the barrier layer 240 will act as a barrier between the first and second polysilicon layers 235, 245 to reduce or eliminate migration of dopant material from one polysilicon layer 235, 245 to the other.

The second polysilicon layer 245 is then deposited above the barrier layer 240 by any of a variety of known techniques, as discussed above. The second polysilicon layer 245 thus formed has a thickness ranging from approximately 100–1500 Å. A second dopant material may then be introduced into the second polysilicon layer 245. For example, in the first illustrative process flow, the second dopant material is introduced into the second polysilicon layer 245 by performing an ion implantation process as indicated by the arrows 310, shown in FIG. 3C. Depending upon the application, n-type dopant material such as arsenic (As) or phosphorous (P) may be implanted into the second polysilicon layer 245. In one embodiment, the second dopant material may be implanted at a dopant dose of ranging from approximately $10^{13}$–$10^{16}$ ions/cm$^2$ and at an energy level ranging from approximately 1–50 keV. However, it should be understood that the present invention should not be considered as limited to these specific implant parameters unless such limitations are expressly set forth in the appended claims.

Although in the first illustrative process flow described above, the dopant materials are introduced into the first and second polysilicon layers 235, 245 by implanting the dopant materials substantially after depositing the first and second polysilicon layers 235, 245, the present invention is not so limited. In one alternative embodiment, the dopant materials may be introduced into the first and/or second polysilicon layers 235, 245 at substantially the same time as the first and/or second polysilicon layers 235, 245 are being deposited. For example, p-type dopant materials such as boron (B) or boron fluoride ($BF_2$) may be introduced into the first polysilicon layer 235 as the first polysilicon layer 235 is being deposited.

Figure 3D:
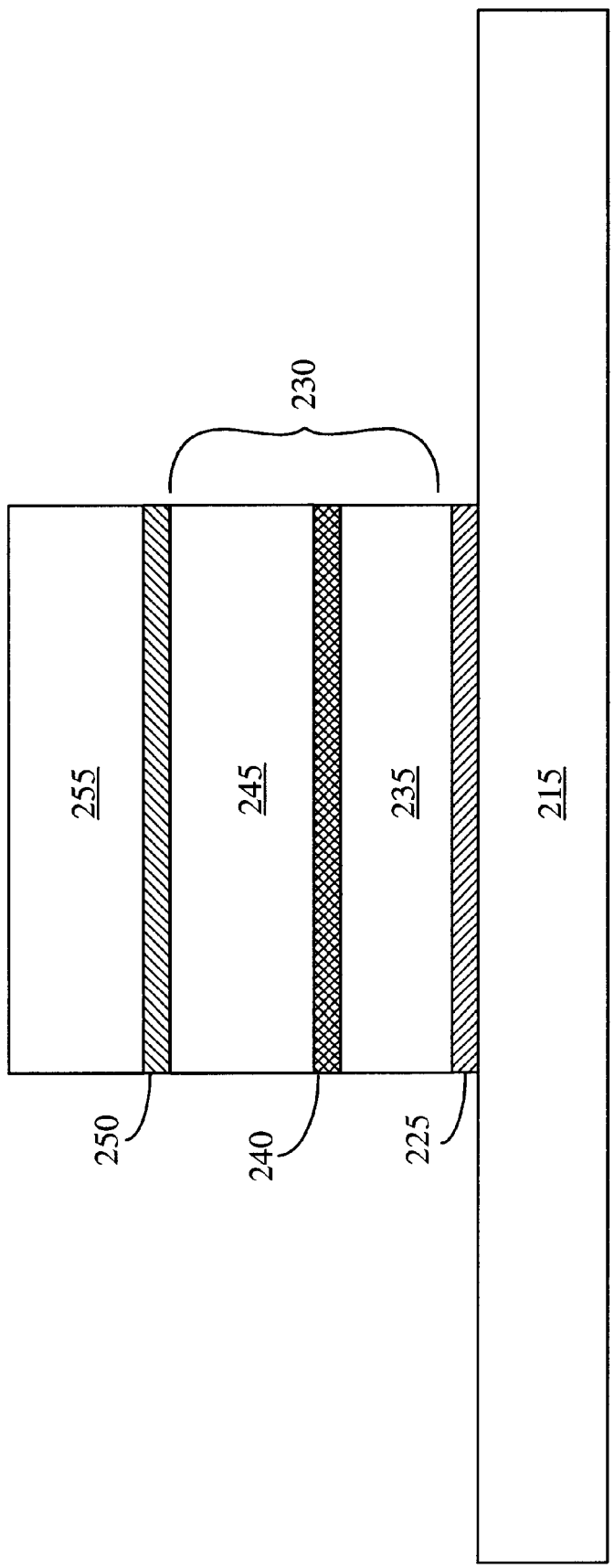

The second insulating layer 250 and the control gate 255 are then formed above the second polysilicon layer 245 by techniques well-known to those of ordinary skill in the art, as shown in FIG. 3D. In one embodiment, the layers may then be etched by one or more of a variety of well-known photolithography and etching techniques to form the completed gate stack shown in FIG. 3D.

A second illustrative process flow that may be used to form the first embodiment of the memory cell 200 will now be described with reference to FIGS. 4A–B and 3D. In the interest of clarity, the various components depicted in FIGS. 4A–B are shown as they appear in the completed gate stack shown in FIG. 3D. However, it will be appreciated by those of ordinary skill in the art that, in one embodiment, these components may be formed by forming layers of the appropriate materials that extend over a larger area of the substrate 215. The layers may then be etched by one or more of a variety of well-known etching techniques to form the completed gate stack shown in FIG. 3D.

In the second illustrative process flow, any of the variety of techniques described with regard to the first illustrative process flow may be used to form the structure shown in FIGS. 4A–B, which includes the first insulating layer 225 formed above the substrate 215, the first polysilicon layer 235, the barrier layer 240, and the second polysilicon layer 245.

Referring now to FIG. 4A, a first ion implantation process, indicated by the arrows 400, is used to introduce dopant ions of a first type of dopant material into the first polysilicon layer 235. In one embodiment, the dopant ions are selectively introduced into the first polysilicon layer 235 by implanting the dopant ions at a first energy such that the dopant ions are deposited at a controlled depth. For example, the first energy may be chosen such that the ion implant range is at about a mid-point of the first polysilicon layer 235. For a more particular example, if the first polysilicon layer 235 has a thickness of about 300 Å, the barrier layer 240 has a thickness of about 30 Å, and the second polysilicon layer 245 has a thickness of about 300 Å, performing an ion implantation process using boron (B) ions having an energy of approximately 12 keV, may result in the boron (B) ions being selectively introduced into the first polysilicon layer 235.

Referring now to FIG. 4B, a second ion implantation process, indicated by the arrows 410, is used to introduce dopant ions of a second type of dopant material into the second polysilicon layer 245. In one embodiment, the dopant ions are selectively introduced into the second polysilicon layer 245 by implanting the dopant ions at a second energy such that the dopant ions are deposited at a controlled depth. For example, the second energy may be chosen such that the ion implant range is at about a mid-point of the second polysilicon layer 245. For a more particular example, if the first polysilicon layer 235 has a thickness of about 300 Å, the barrier layer 240 has a thickness of about 30 Å, and the second polysilicon layer 245 has a thickness of about 300 Å, performing an ion implantation process using arsenic (As) ions having an energy of approximately 1–15 keV, may result in the arsenic (As) ions being selectively introduced into the second polysilicon layer 245.

The second insulating layer 250 and the control gate 255 are then formed above the second polysilicon layer 245 by techniques well-known to those of ordinary skill in the art, as shown in FIG. 3D.

Figure 5:
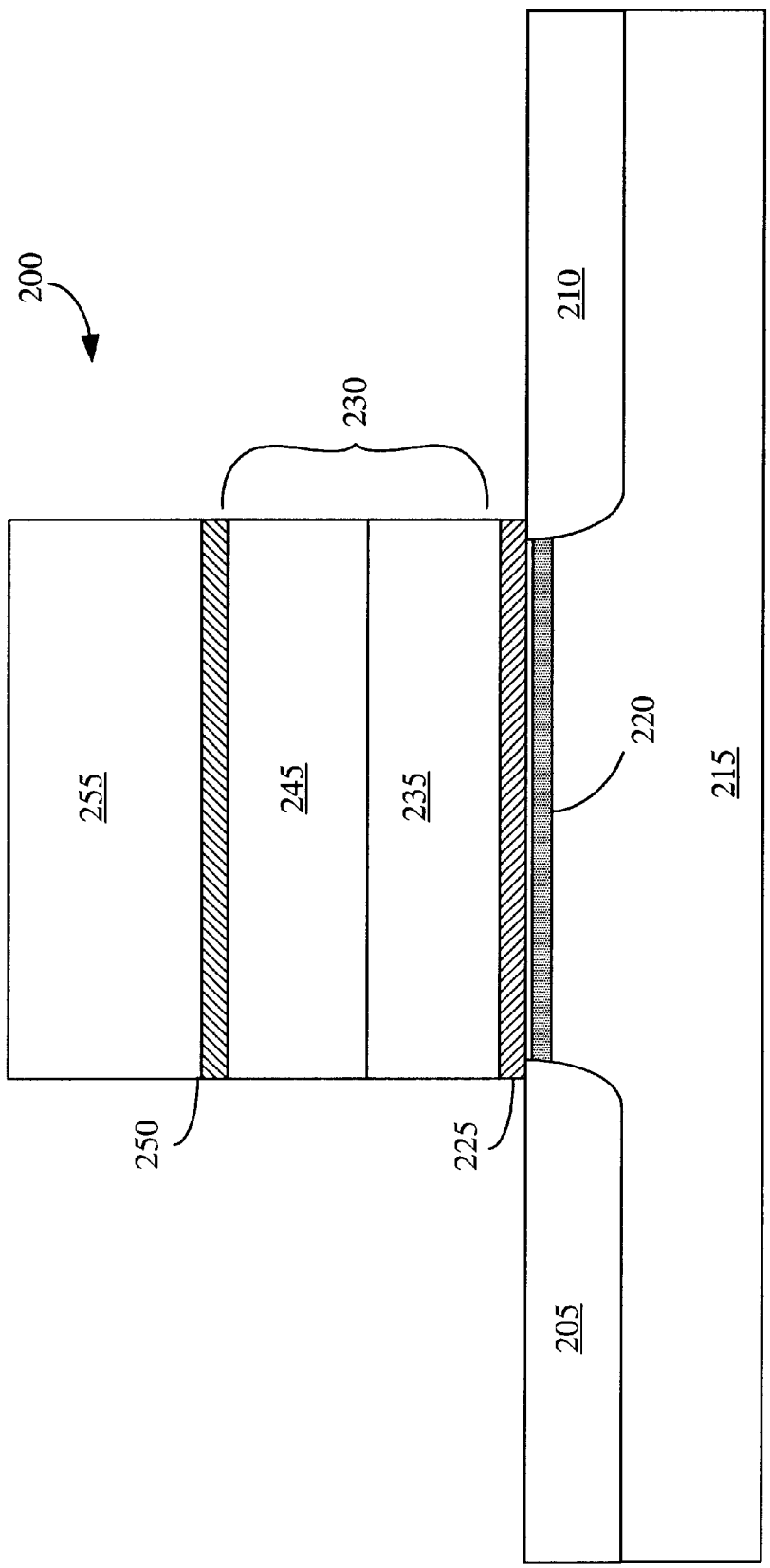
FIG. 5 is a cross-sectional view illustrating a second embodiment of the memory cell including a double-doped floating gate.

Referring now to FIG. 5, a second exemplary embodiment of the memory cell 200 is shown. The second exemplary embodiment of the memory cell 200 includes the source region 205 and the drain region 210 in the substrate 215. As discussed above, the source region 205, the drain region 210, and the substrate 215 may be comprised of a variety of semiconductor materials well-known to those of ordinary skill in the art. The memory cell 200 also includes the first insulating layer 225, which is located above the channel 220. The first insulating layer 225 may have a thickness ranging from approximately 10–100 Å and may be formed from a variety of dielectric materials, as discussed above.

The second exemplary embodiment of the memory cell 200 also includes a double-doped floating gate 230, which includes the first polysilicon layer 235 and the second polysilicon layer 245. As discussed above, the first polysilicon layer 235 has a thickness ranging from approximately 100–500 Å and may be doped with a p-type dopant material. For example, the first polysilicon layer 235 may be doped with boron atoms to a first dopant concentration ranging from approximately $10^{15}$–$10^{20}$ atoms/cm$^3$. Similarly, the second polysilicon layer 245 has a thickness of approximately 100–1500 Å and may be doped with an n-type dopant material. For example, the second polysilicon layer 245 may be doped with arsenic atoms to a second dopant concentration ranging from approximately $10^{18}$–$10^{21}$ atoms/cm$^3$. However, it should be understood that the present invention should not be considered as limited to these specific parameters unless such limitations are expressly set forth in the appended claims.

The second exemplary embodiment of the memory cell 200 further includes the second insulating layer 250 and the control gate 255 positioned above the second insulating layer 250. The second insulating layer 250 may have a thickness ranging from approximately 80–300 Å and may include a variety of dielectric materials, as discussed above. In the illustrated embodiment, the control gate 255 is doped with an n-type dopant material. For example, the control gate 255 may be doped with arsenic atoms to a dopant concentration of about $10^{19}$–$10^{21}$ atoms/cm$^3$.

As the second embodiment of the memory cell 200 differs from the first embodiment of the memory cell 200 in that the second embodiment does not include the barrier layer 240, it will be appreciated by those of ordinary skill in the art having benefit of the present disclosure that the second embodiment of the memory cell 200 may be formed by a third illustrative process flow that is similar to at least the first and second illustrative process flows described above. In the third illustrative process flow, the first insulating layer 225 is formed above the substrate 215 and the first polysilicon layer 235 is deposited above the first insulating layer 225. The first dopant material is then introduced into the first polysilicon layer 235 by performing an ion implantation process. The second polysilicon layer 245 is then deposited above the first polysilicon layer 235 and the second dopant material is introduced into the second polysilicon layer 245 by performing an ion implantation process. The second insulating layer 250 and the control gate 255 are then formed above the second polysilicon layer 245.

Referring now to FIGS. 2–5, the first, second, and third illustrative process flows have been described with reference to the first and second embodiments of the memory cell 200. However, it will be appreciated that the present invention is not limited to the above described examples. Elements of the first, second, and third illustrative process flows may be combined in any desirable manner and used to form the first and second embodiments of the memory cell 200, as well as any other desirable embodiments of the present invention, without departing from the scope of the present invention. Although the number of potential combinations of the aforementioned elements is large, in one illustrative example the second embodiment of the memory cell 200 may be formed by depositing the first polysilicon layer 235 in the manner described above. Then, the second polysilicon layer 245 may be deposited and dopant atoms of the second type of dopant material may be introduced into the second polysilicon layer 245 as the second polysilicon layer 245 is being deposited. The first ion implantation process, described above with reference to FIG. 4A, may then be used to implant dopant atoms of the first type of dopant material into the first polysilicon layer 235.

Figure 6:
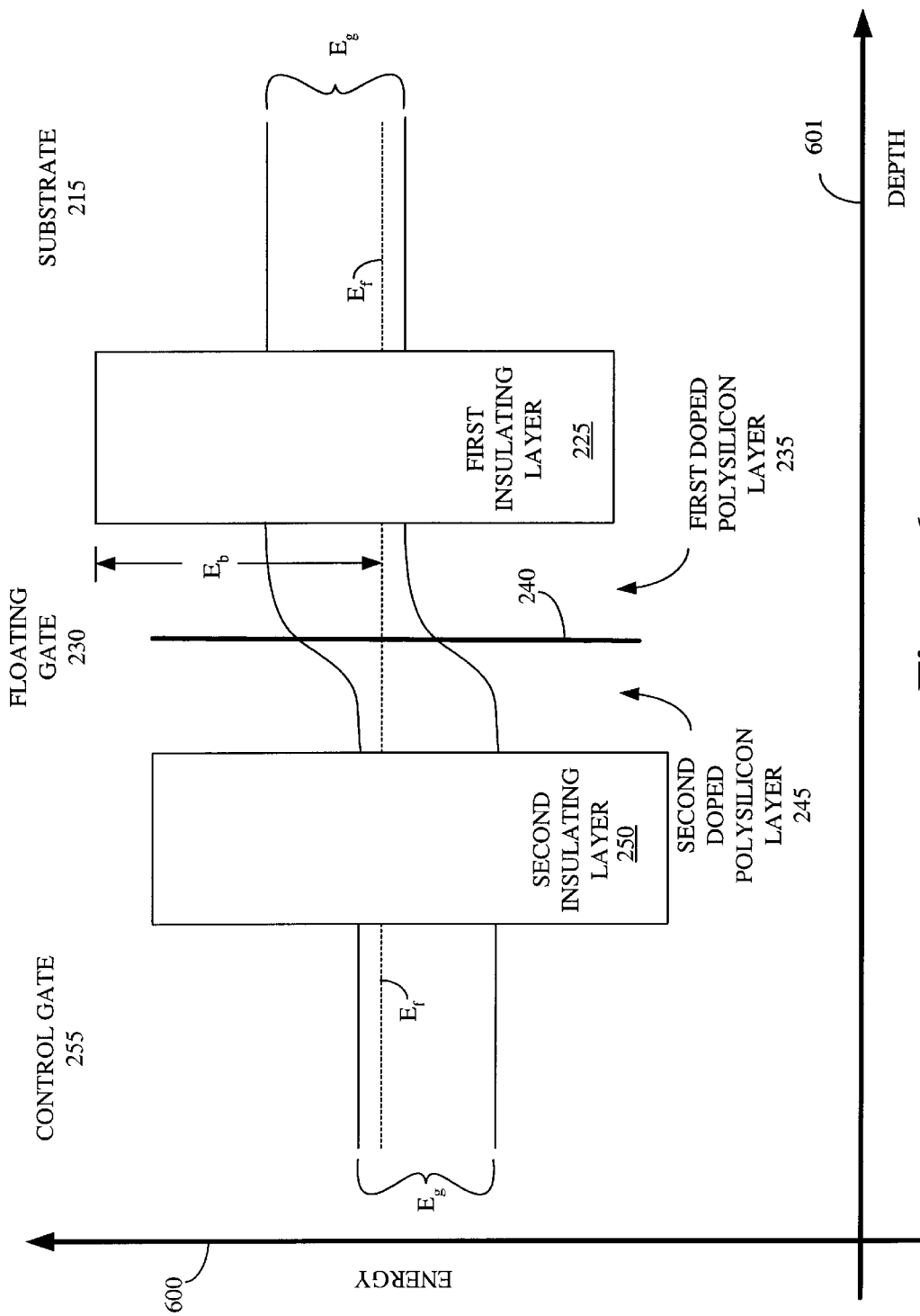
FIG. 6 shows an energy level diagram depicting energy levels in the memory cell shown in FIG. 2.

Referring now to FIG. 6, an energy diagram illustrating exemplary energy levels in the memory cell 200 is shown. An axis 600 indicates that energy increases upward in FIG. 4 and an axis 601 indicates that depth, measured from a top surface of the control gate 255, increases from left to right. An energy band gap $E_g$ for the electrons in the control gate 255, the double-doped floating gate 230, and the substrate 215 is shown, as well as the Fermi energy $E_f$ in the same regions. By forming the double-doped floating gate 230 from the first and the second polysilicon layers 235, 245, the energy band gap $E_g$ in the double-doped floating gate 230 is shifted. Consequently, the barrier energy $E_b$ created by the first insulating layer 225 is increased. For example, in one embodiment, the barrier energy $E_b$ is increased from about 3.2 eV to about 4 eV.

The electrons in the double-doped floating gate 230 tunnel through the first insulating layer 225 to reach the substrate 215. Consequently, by increasing the barrier energy $E_b$ in the manner described above, the leakage current is decreased and the data retention time of the memory cell 200 is increased. Similarly, in alternative embodiments, increasing the barrier energy $E_b$ in the manner described above may allow the same data retention times to be achieved using a thinner first insulation layer 225.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a first dielectric layer on a semiconductor substrate;

forming a floating gate above the first dielectric layer, the floating gate comprised of a first polysilicon layer doped with a first type of dopant material and a second polysilicon layer doped with a second type of dopant material that is opposite the first type of dopant material in the first polysilicon layer, wherein forming the floating gate comprises depositing the first polysilicon layer above the dielectric layer and depositing the second polysilicon layer above the first polysilicon layer;

forming a second dielectric layer above the floating gate;

forming a control gate above the second dielectric layer; and forming a source and a drain in the substrate.

2. The method of claim 1, wherein forming the first polysilicon layer above the dielectric layer and the second polysilicon layer above the first polysilicon layer further comprises performing a first ion implantation process at a first energy to introduce dopant atoms of the first type of dopant material into the first polysilicon layer and performing a second ion implantation process at a second energy to introduce dopant atoms of the second type of dopant material into the second polysilicon layer with a second dopant, wherein the first energy is larger than the second energy.

3. The method of claim 2, wherein performing the ion implantation process at the first energy comprises performing the ion implantation process at the first energy such that the ion implant range is at about a mid-point of the first polysilicon layer and a first dopant dose of approximately $10^{10}$–$10^{15}$ atoms/cm$^2$.

4. The method of claim 3, wherein performing the ion implantation process at the second energy comprises performing the ion implantation process at the second energy such that the ion implant range is at about a mid-point of the second polysilicon layer and a second dopant dose of approximately $10^{13}$–$10^{16}$ atoms/cm$^2$.

5. A method, comprising:

forming a first dielectric layer on a semiconductor substrate;

depositing a first polysilicon layer above the first dielectric layer;

forming a barrier layer above the first polysilicon layer;

depositing a second polysilicon layer above the barrier layer;

performing a first ion implantation process to introduce a first type of dopant material into the first polysilicon layer using a first dopant dose of approximately $10^{10}$–$10^{15}$ ions/cm$^2$ at a first energy such that an ion implant range is at al)out a mid-point of the first polysilicon layer;

performing a second ion implantation process to introduce a second type of dopant material into the second polysilicon layer using a second dopant dose of approximately $10^{13}$–$10^{16}$ ions/cm$^2$ at a second energy, wherein the first energy is larger than the second energy;

forming a second dielectric layer above the second polysilicon layer;

forming a control gate above the second dielectric layer; and forming a source and a drain in the substrate.

6. A method, comprising:

forming a first dielectric layer on a semiconductor substrate;

depositing a first polysilicon layer above the first dielectric layer;

forming a barrier layer above the first polysilicon layer;

depositing a second polysilicon layer above the barrier layer;

performing a first ion implantation process to introduce a first type of dopant material into the first polysilicon layer using a first dopant dose of approximately $10^{10}$–$10^{15}$ ions/cm$^2$ at a first energy;

performing a second ion implantation process to introduce a second type of dopant material into the second polysilicon layer using a second dopant dose of approximately $10^{13}$–$10^{16}$ ions/cm$^2$ at a second energy such that an ion implant range is at about a mid-point of the second polysilicon layer, wherein the first energy is larger than the second energy;

forming a second dielectric layer above the second polysilicon layer;

forming a control gate above the second dielectric layer; and forming a source and a drain in the substrate.

* * * * *